United States Patent [19]

Fujimoto et al.

[11] Patent Number: 5,128,823
[45] Date of Patent: Jul. 7, 1992

[54] POWER SEMICONDUCTOR APPARATUS

[75] Inventors: Hiroshi Fujimoto, Kariya; Masami Yamaoka, Anjo; Yukio Tsuzuki, Aichi, all of Japan

[73] Assignee: Nippondenso Co., Ltd., Kariya, Japan

[21] Appl. No.: 365,765

[22] Filed: Jun. 14, 1989

[51] Int. Cl.⁵ .................. H02H 7/20; H01L 28/78
[52] U.S. Cl. .................. 361/93; 361/101; 361/103; 307/310; 307/574; 358/42
[58] Field of Search ............. 361/97, 98, 101, 103; 307/296.5, 310, 570, 571, 573, 574, 568, 300; 357/23.5, 23.13, 28, 23.12, 42; 223/284, 312

[56] References Cited

U.S. PATENT DOCUMENTS

| | | | |
|---|---|---|---|
| 3,837,071 | 9/1974 | Ronen | 357/23.12 |
| 3,887,863 | 6/1975 | Brokaw | 323/316 |
| 4,553,048 | 11/1985 | Bynum et al. | 361/103 X |
| 4,553,084 | 11/1985 | Wrathall | 361/87 X |
| 4,703,390 | 10/1987 | Foy et al. | 361/101 |
| 4,760,434 | 7/1988 | Tsuzuki et al. | 357/23.13 |
| 4,783,690 | 11/1988 | Walden et al. | 323/316 |
| 4,818,719 | 4/1989 | Yeh et al. | 357/42 |
| 4,835,649 | 5/1989 | Salerno | 361/101 X |
| 4,879,584 | 11/1989 | Takagi et al. | 357/42 |
| 4,885,477 | 12/1989 | Bird et al. | 307/296.8 |
| 4,994,871 | 2/1991 | Chang et al. | 357/42 |

FOREIGN PATENT DOCUMENTS

| | | | |
|---|---|---|---|
| 69524 | 1/1983 | European Pat. Off. | 357/42 |
| 59-04066 | 1/1984 | Japan | 357/42 |
| 60-94772 | 5/1985 | Japan | |

OTHER PUBLICATIONS

Nikkei Electronics 1979, 9.17, pp. 179–194.

Primary Examiner—Howard L. Williams
Attorney, Agent, or Firm—Cushman, Darby & Cushman

[57] ABSTRACT

A power MOS transistor and a current sensing MOS transistor have a common drain electrode connected to a load. The gates of these MOS transistors are commonly controlled in response to an input control signal. A load current sensing resistor element is connected between the source electrodes of these transistors. A voltage signal sensed by the load sensing resistor element is amplified by a differential amplifier constituted by a pair of depletion type MOS transistors. The amplified output controls the MOS transistors, and the MOS transistors variably control a voltage of the input control signal to be supplied to the power and current sensing MOS transistors. The power MOS transistor, the current sensing MOS transistor, the depletion MOS transistor, the current control MOS transistor, and the like have the same conductivity type.

11 Claims, 5 Drawing Sheets

POWER SEMICONDUCTOR APPARATUS

BACKGROUND OF THE INVENTION

1. Field of the Invention

The present invention relates to a power semiconductor apparatus for controlling a power and, more particularly, to a composite power semiconductor apparatus having a protection function together with an over-current sensing function and which incorporates an active power element and control elements having sensing functions of, e.g., a temperature, a voltage, and a current on a single chip semiconductor substrate.

2. Description of the Related Art

In a power semiconductor apparatus for controlling a power, when a fault such as short-circuiting occurs in a load controlled by the semiconductor apparatus, an overcurrent is supplied to this semiconductor apparatus. When such an overcurrent is supplied to the semiconductor apparatus for controlling a power, this semiconductor apparatus, a power source, or other peripheral devices may often receive fatal damage.

Such a power semiconductor apparatus, therefore, need be arranged such that a protection function is set to limit an amount of current supplied to the semiconductor apparatus when an excessive load current flows, thus protecting the semiconductor apparatus and its peripheral devices from breakage.

As a means for protecting such a semiconductor apparatus from an overcurrent, in general, e.g., an overcurrent protection circuit is externally connected to the semiconductor apparatus. More specifically, the overcurrent protection circuit arranged separate from the semiconductor apparatus senses an amount of current supplied to the semiconductor apparatus. When this protection circuit senses a state wherein the amount of current supplied to the semiconductor apparatus exceeds a predetermined amount, i.e., an overcurrent, an operation of the semiconductor apparatus is controlled and interrupted.

When the protection circuit is externally connected to the power semiconductor apparatus as described above, however, a system structure is undesirably large-sized and it is difficult to realize high reliability.

In consideration of the above problems, a composite function element wherein the power semiconductor apparatus and a circuit having an overcurrent protection function are arranged on a single chip has been proposed. This element is known as a DMOS (double diffused MOS) FET. More specifically, in the DMOS-FET, an active element for controlling a power and control elements having sensing functions of, e.g., a temperature, a voltage, and a current, and a protection function utilizing these sensing functions are arranged on a single chip.

Such a power semiconductor apparatus includes a semiconductor element having an active function for controlling a load current In a junction of the semiconductor element having the active function, a load current flows and hence heat is generated. Therefore, for example, when a load is short-circuited and an over-current flows, an excessive current is supplied to the junction of the semiconductor element, and the temperature of the junction is abnormally increased. The semiconductor element may be damaged. For this reason, a protection operation is required to sense an abnormal increase in temperature of a semiconductor substrate on which the above-mentioned active elements are formed, and to ON/OFF-control the semiconductor element in response to the sensed output. A control element unit for performing the above protection operation and the semiconductor element for performing an active operation are formed on a single chip.

Most of the elements for constituting the above composite element have an extremely complicated element structure obtained by, e.g., p-n junction isolation or dielectric isolation. In these constituting elements, a parasitic operation tends to occur. Therefore, an effect of the composite element including the control elements on a single chip cannot be sufficiently enhanced. In addition, since the manufacturing process is complicated, cost of the apparatus is inevitably increased.

Figure 5:
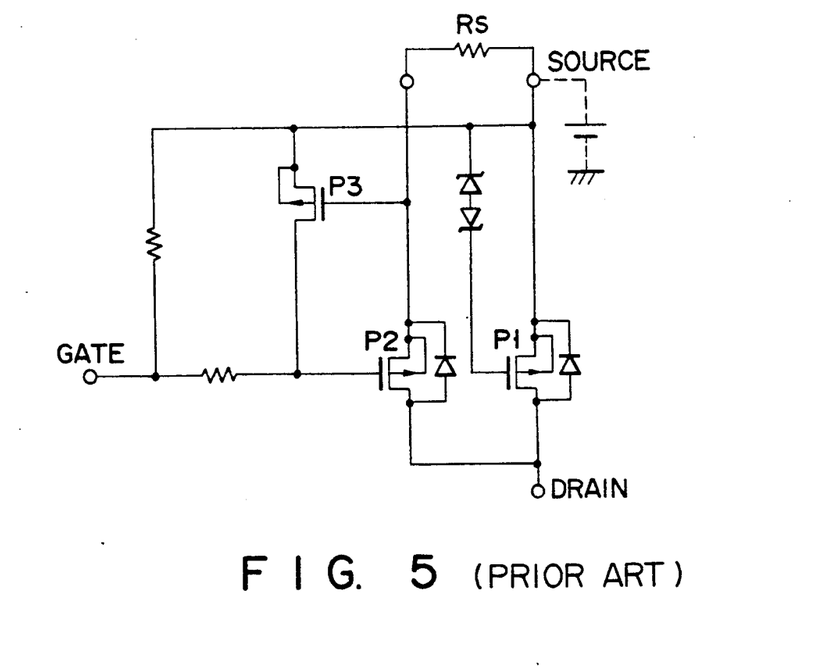
FIG. 5 is a circuit diagram for explaining a conventional power semiconductor apparatus.

For example, a semiconductor circuit shown in FIG. 5 is considered to simplify the manufacturing process. In this circuit, a pair of MOS transistors P1 and P2 constitute a current mirror circuit. The MOS transistors P1 and P2 are controlled in response to an input signal from a gate input terminal, so that a load (not shown) connected to the drain terminals of the transistors is controlled.

For example, an enhancement type p-channel MOS transistor P3 is controlled by a voltage generated across a load current sensing resistor Rs connected to the current mirror circuit, and the load control MOS transistors P1 and P2 are controlled by the MOS transistor P3, thus protecting the circuit from an over-current.

In such a semiconductor circuit, the MOS transistor P3 senses a voltage across the resistor Rs. The voltage corresponding to a threshold voltage $V_T$(about 1 V) of the MOS transistor P3 must be generated across the resistor Rs. For this reason, a current ratio of the MOS transistors P1 and P2 constituting the current mirror circuit is largely shifted from a ratio of the sizes of the MOS transistors, and power source voltage characteristics determine the current ratio. The temperature characteristic of the threshold voltage $V_T$ is about 3 mV/°C., and the temperature characteristic of the current sensing is necessarily and largely increased.

SUMMARY OF THE INVENTION

It is an object of the present invention to provide a single-chip power semiconductor apparatus having a protection function for executing a reliable protection operation for an active element unit, which can be manufactured by a very simple manufacturing process.

It is another object of the present invention to provide a power semiconductor apparatus for preventing an increase in number of manufacturing steps by constituting a protection function unit by a p- or n-channel MOS transistor.

It is still another object of the present invention to provide a power semiconductor apparatus wherein a control element for exhibiting a control function except for the above-mentioned active function is formed on a semiconductor substrate on which a semiconductor element having the active function for controlling, e.g., a load current is formed, the power semiconductor apparatus having a composite function obtained by arranging the control element and the active element on a single semiconductor chip in accordance with a sufficiently simplified element structure without complicating the manufacturing process.

A power semiconductor apparatus according to the present invention is arranged such that a control amplifier including a differential amplifier constituted by a pair of depletion type MOS transistors in an input stage of the control amplifier is formed on a semiconductor chip on which an active element constituted by a load control MOS transistor is formed, and a voltage signal across a resistor element for sensing a current supplied to an active element unit is supplied to the differential amplifier as an input signal.

In this power semiconductor apparatus, a p- or n-type well is formed in a semiconductor substrate on which the active element is to be formed to constitute a control element using enhancement and depletion type MOSFETs of either n- or p-channel formed on the well.

In the power semiconductor apparatus having the above arrangement, the pair of depletion type MOS transistors constitute the differential amplifier, so that a voltage sensed by the resistor element for sensing a load current amount can be lowered to several hundreds of mV or less. Therefore, the resistance of the load current sensing, resistor element can be sufficiently decreased, and the precision of the temperature and power source voltage characteristics are remarkably improved. When this semiconductor apparatus is manufactured, one mask may be added to obtain the depletion type MOS transistor. Therefore, the semiconductor apparatus having the protection function can be manufactured in substantially the same manufacturing steps as those in a conventional semiconductor apparatus.

In the depletion type MOS transistor, a self-heat generation problem is posed. However, the power semiconductor element for generating heat larger than that of the depletion type MOS transistor and the depletion type MOS transistor are formed on a single chip. Therefore, a sufficient heat dissipation countermeasure is taken, and hence this heat generation problem in the depletion type MOS transistor is satisfactorily solved.

DETAILED DESCRIPTION OF THE PREFERRED EMBODIMENTS

Figure 1:
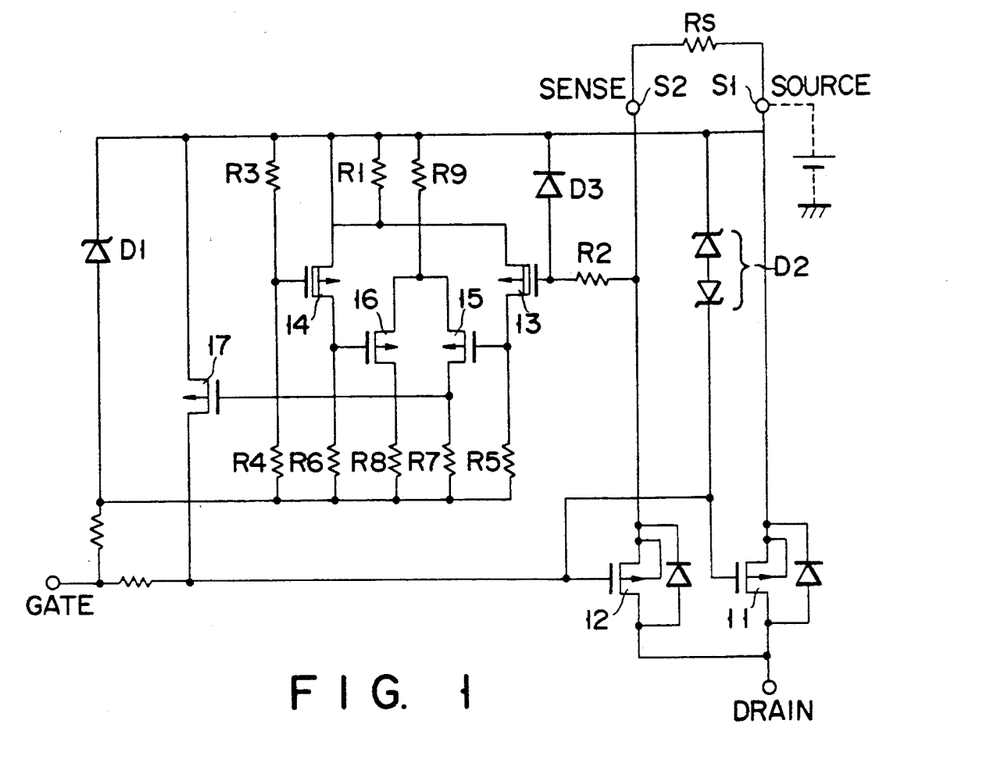
FIG. 1 is a circuit diagram for explaining a power semiconductor apparatus according to an embodiment of the present invention.

FIG. 1 is a circuit diagram showing a circuit arrangement of a power semiconductor apparatus, and all circuit parts shown in FIG. 1 are formed on a single semiconductor chip.

A gate input signal for controlling a load (not shown) is supplied to the gate electrodes of power and current sensing MOS transistors 11 and 12. The MOS transistors 11 and 12 constitute a current mirror circuit. A load (not shown) is connected to a common terminal connected to the drains of the MOS transistors 11 and 12.

The source electrode of the power MOS transistor 11 is connected to a source terminal S1. A power source is connected to the source terminal S1. The source electrode of the current sensing MOS transistor 12 is connected to a current sensing terminal S2. A current sensing resistor element Rs is connected between the terminals S1 and S2.

The MOS transistors 11 and 12 constitute a load control active element. In addition, a current limitation circuit is formed on the semiconductor chip on which the active element is formed. This current limitation circuit is constituted by a control amplifier including an input stage having a pair of depletion type MOS transistors 13 and 14.

The source electrodes of the depletion type MOS transistors 13 and 14 are commonly connected to form a common terminal. The power source is connected to the common terminal through a resistor R1. The MOS transistors 13 and 14 have equal source potentials and constitute a differential amplifier. The gate electrode of the MOS transistor 13 receives a voltage signal from the sensing terminal S2 through a resistor R2.

The gate electrode of the MOS transistor 14 constituting the differential amplifier always receives a voltage divided by resistors R3 and R4. Since the MOS transistor 14 consists of the depletion type MOS transistor, the threshold voltage of the differential amplifier can be set approximate to a maximum potential corresponding to the source potential of the power MOS transistor 11.

The drain electrodes of the MOS transistors 13 and 14 constituting the differential amplifier are connected to load resistors R5 and R6, respectively. However, the gain of the amplifier obtained by the resistors R5 and R6 is insufficient. Therefore, enhancement type MOS transistors 15 and 16 perform further amplification. The source electrodes of the MOS transistors 15 and 16 are commonly connected to form a common terminal. The power source is connected to the common terminal through a resistor R9. Load resistors R7 and R8 are respectively connected to the MOS transistors 15 and 16, and an amplified output obtained by the load resistor R7 is supplied to the gate electrode of a current control MOS transistor 17.

The current control MOS transistor 17 variably controls a voltage supplied to the gate electrodes of the power and current sensing MOS transistors 11 and 12. The current control MOS transistor 17 performs an operation for limiting a current to be supplied to the load from the drain terminal.

In this circuit, a Zener diode D1 is used to determine a power source voltage of the differential amplifier. In addition, diodes D2 and D3, and the resistor R2 are used to protect the MOS transistors.

In the semiconductor circuit having the above arrangement, the MOS transistors 11 and 12 constitute the current mirror circuit. Therefore, assuming that the resistance of the sensing resistor element Rs is, e.g., "0Ω", the source potentials of the MOS transistors 11 and 12 are equal to each other. Therefore, in this case, a ratio of currents supplied to the MOS transistors 11 and 12 corresponds to a ratio of their sizes.

When the current sensing resistor element Rs is inserted and set, a voltage corresponding to an amount of current supplied to the MOS transistor 12 is generated across the resistor element Rs. However, the voltage across the resistor element Rs serves as a difference between the source potentials of the MOS transistors 11 and 12. Therefore, a ratio of the currents supplied to the MOS transistors 11 and 12 is shifted.

The value of the current supplied to the power MOS transistor 11 for controlling the load appears as a terminal voltage of the sensing resistor element Rs. A load current value is sensed in accordance with the voltage appearing across the terminals of the resistor element Rs. A larger sensed voltage value is advantageous for the control amplifier. However, when this sensed voltage value is increased, a shift in the current ratio between the MOS transistors 11 and 12 is also increased.

In the circuit shown in FIG. 1, however, the pair of depletion type MOS transistors 13 and 14 constitute the differential amplifier, so that its threshold voltage can be set approximate to the power source voltage. For this reason, the voltage sensed by the sensing resistor element Rs can be minimized, and hence a shift in the ratio of currents supplied to the MOS transistors 11 and 12 can be decreased, thus effectively improving the precision.

In general, since the depletion type transistor is always set in an ON state, its heat generation becomes problematic. However, the depletion type MOS transistors 13 and 14 according to this embodiment and the power MOS transistor 11 are arranged on a single semiconductor chip.

Figure 2:
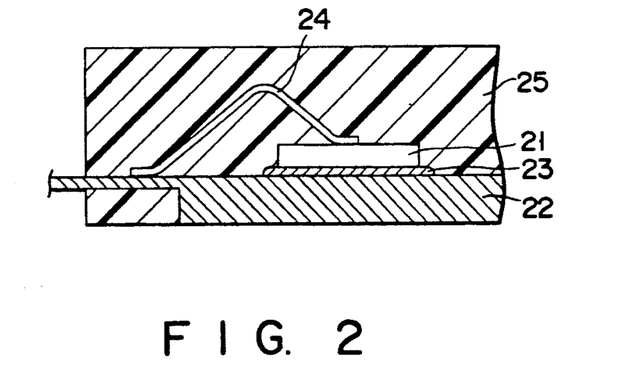
FIG. 2 is a sectional view for explaining a state wherein the semiconductor apparatus is molded.

As shown in FIG. 2, a semiconductor chip 21 on which the power MOS transistor is set is mounted on a lead frame 22 having a normal heat sink effect by a solder 23. In this case, the thickness of a portion of the lead frame 22 to which the semiconductor chip 21 is mounted is larger than that of other portions to sufficiently enhance the heat sink effect. When the power element is normally used, a heat dissipation countermeasure using a heat sink is taken. Referring to FIG. 2, reference numeral 24 denotes a wire, and the lead frame 22 and the semiconductor chip are molded by a molding resin 25.

In the circuit shown in FIG. 1, the currents supplied to the pair of MOS transistors 13 and 14, and to the pair of MOS transistors 15 and 16 are respectively determined by the resistors R1 and R9. However, these resistors can be replaced by the depletion type p-channel MOS transistors. Although the loads of the MOS transistors 13 to 16 are respectively constituted by the resistors R5 to R8, these resistor elements can also be replaced by the p-channel MOS transistors. In addition, although the current sensing resistor element Rs and, e.g., the MOS transistor can be formed on the single chip, this resistor element Rs may be arranged outside the above semiconductor chip, and may be externally connected to the circuit.

When another MOS transistor is set in parallel to the MOS transistor 17 for executing a current limitation operation, and the gate and source electrodes of this MOS transistor also serve as those of the MOS transistor 17, the added MOS transistor can be used as an output transistor, and a current limiting signal can be externally output.

According to the power semiconductor apparatus having the above arrangement, an input stage of a circuit for executing a current limitation control is constituted by the differential amplifier using the pair of depletion type MOS transistors. Therefore, the threshold voltage of the differential amplifier can be set approximate to the power source voltage, and a voltage across the terminals of the load current sensing resistor element can be sufficiently minimized. Therefore, a shift in a current ratio between the load control power MOS transistor 11 and the current sensing MOS transistor 12 which constitute the current mirror circuit can be minimized, thus improving the operational precision of the circuit.

Figure 3:
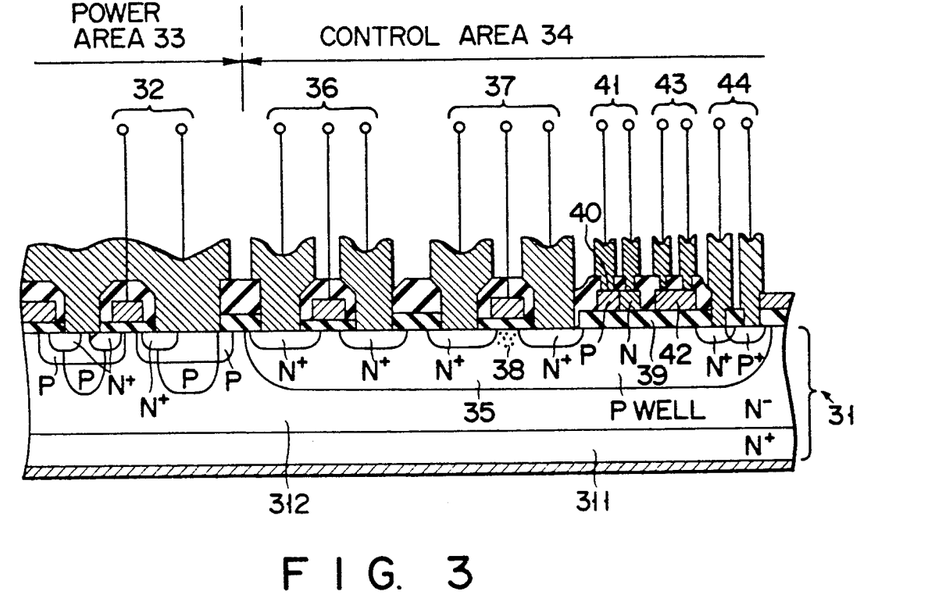
FIG. 3 is a sectional view showing a sectional structure of the semiconductor apparatus.

FIG. 3 shows an sectional structure of the semiconductor apparatus which realizes a semiconductor circuit obtained by constituting the circuit including a P-channel transistor shown in FIG. 1 of an n-channel transistor. A semiconductor substrate 31 includes an n+-type low-resistance layer 311 and an n--type high-resistance layer 312. A power area 33 is set in which, e.g., a semiconductor element 32 having an active function for controlling a load current is formed on the semiconductor substrate 31. A control area 34 is set on the substrate 31 and is separated from the power area 33. A comparator, a current sensor, a voltage sensor, and the like for performing various control operations are formed in the control area 34.

The control area 34 is formed in an area including a p-type well 35 formed in a surface portion of the semiconductor substrate 31. N-channel MOSFETs 36 and 37 are formed on the p-type well 35. In this case, the MOSFET 36 is of an enhancement type. By implanting n+-type ions 38 using a mask, the MOSFET 37 is of a depletion type.

In a portion corresponding to the p-type well 35 which defines the control area 34, an insulating layer 39 consisting of a silicon oxide film is formed at a position different from a portion on which the MOSFETs 36 and 37 are formed. A polysilicon layer 40 is formed on the insulating layer 39. A p-n junction is formed on the polysilicon layer 40 portion, so that a diode 41 is formed.

Polysilicon resistance layer 42 is formed on the insulating layer 39, and the resistance layer 42 forms the resistor element. In addition, a Zener diode 44 is formed on the p-type well 35.

In the control area 34 corresponding to the p-type well 35, a control circuit is provided for executing a control operation using a function different from that of the semiconductor element 32 and the like formed in the power area 33.

In the semiconductor apparatus having the above arrangement, the protection circuit of the semiconductor apparatus, the control circuit for externally inputting/outputting signals, and the like are arranged on the single semiconductor chip. In this case, when p-n junction isolation, dielectric isolation, or the like is employed for an element structure of the control circuit, CMOS and bipolar elements can be formed. However, the structure is very complicated and cost is inevitably increased.

The semiconductor apparatus shown in FIG. 3, however, e.g., the diode, the resistor element, and the Zener diode are simultaneously arranged in the control area 34 on the semiconductor substrate 31. Similarly, generally known circuit elements such as an inverter, an operational amplifier, and a reference voltage generator can be formed on a single semiconductor chip, thus arbitrarily arranging various composite function elements.

For example, the reference voltage power source and the like are formed in the power semiconductor apparatus, so that the number of parts of the peripheral devices can be greatly decreased, thus effectively improving reliability.

In FIG. 3, the n-channel enhancement and depletion type MOSFETs are arranged in the p-type well 35 formed on the semiconductor substrate 31. However, if an n-type well is formed on the same portion in place of the p-type well, only p-channel enhancement and depletion type MOSFETs are formed, and the control element can be arranged by a p-channel MOSFET.

If the control element unit is constituted by, e.g., a CMOS, a latch-up phenomenon may occur.

Assume that the conductivity type of the transistor in the power area is different from that of the control area. If the p-type well 35 in FIG. 3 is eliminated and the MOSFETs 36 and 37 consist of p-channel transistors, the latch-up phenomenon (parasitic thyristor operation) occurs between the MOSFETs 32 and 36.

On the contrary, as shown in FIGS. 1 and 3, when the transistor corresponding to the power area and all the transistors in the control area have the same conductivity type, the latch-up phenomenon can be prevented. More specifically, in the semiconductor apparatus according to this embodiment, the depletion type transistors are combined and used, so that all the transistors can have the same conductivity type. As a result, the latch-up phenomenon can be prevented to improve the reliability without any failure.

Figure 4:
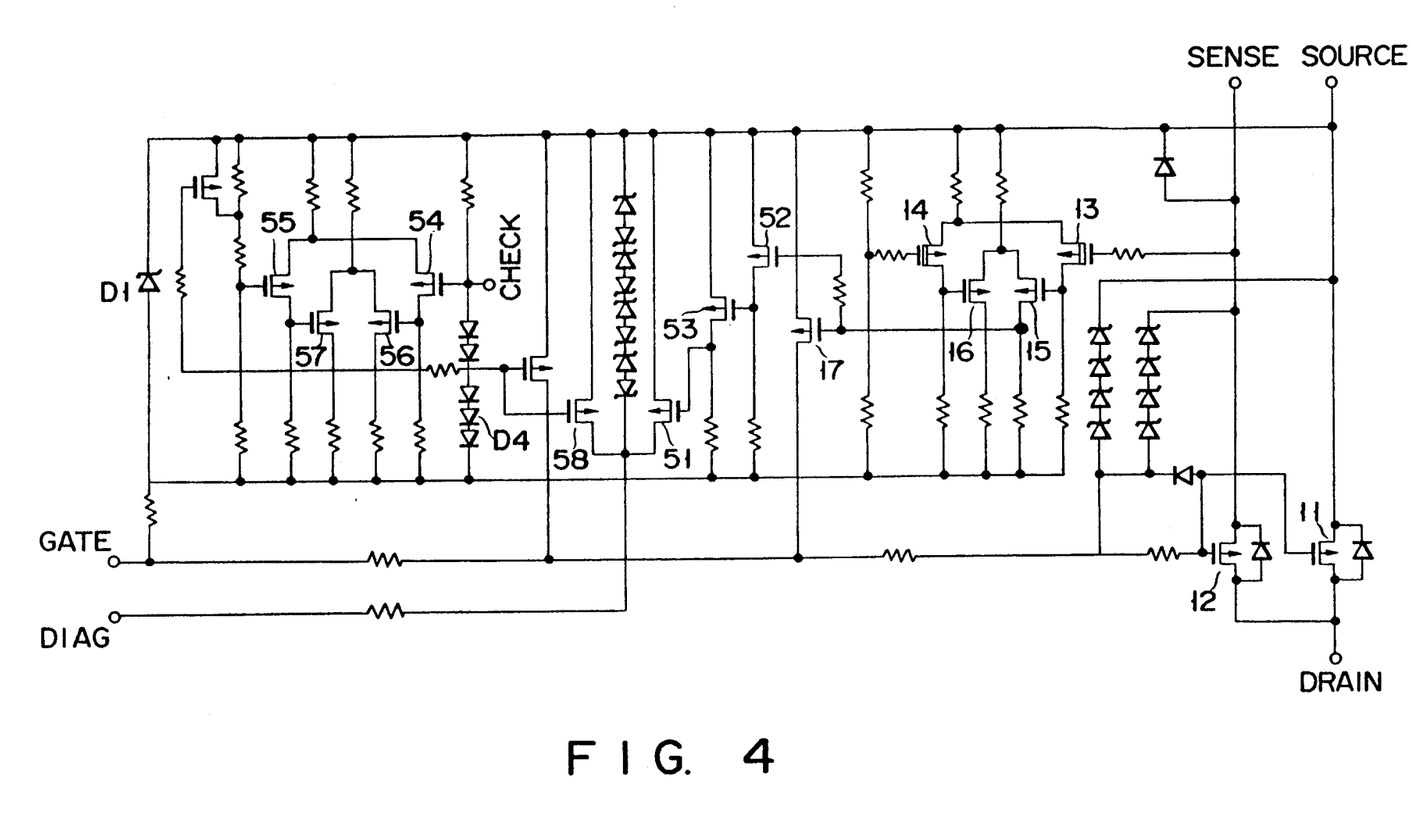
FIG. 4 is a circuit diagram showing a power semiconductor apparatus according to another embodiment of the present invention.

FIG. 4 shows a circuit arrangement according to another embodiment. In this embodiment, a MOS transistor 17 for controlling the gate of a power MOS transistor 11, and a MOS transistor 52 which has the gate common to that of the MOS transistor 17 are arranged. Therefore, when a current is limited, a limitation signal is output as a diagnostic signal. Note that, in FIG. 4, two inverter circuits each constituted by MOS transistors 52 and 53 are added between the MOS transistors 17 and 51, and the capability of the diagnostic current is improved.

In this semiconductor circuit, a protection circuit for sensing the load current to execute a protection operation from an overcurrent and a temperature protection circuit are arranged to cause a differential amplifier constituted by MOS transistors 54, 55, 56, and 57 to amplify a temperature sensing signal sensed by a diode D4, thus controlling a MOS transistor 58. This MOS transistor 58 controls the power MOS transistor 11. For example, when the semiconductor substrate temperature is abnormally increased, a load current is limited. In this case, an output signal from the MOS transistor 58 is output as a diagnostic signal together with an output from the protection circuit from the overcurrent.

Figure 6:
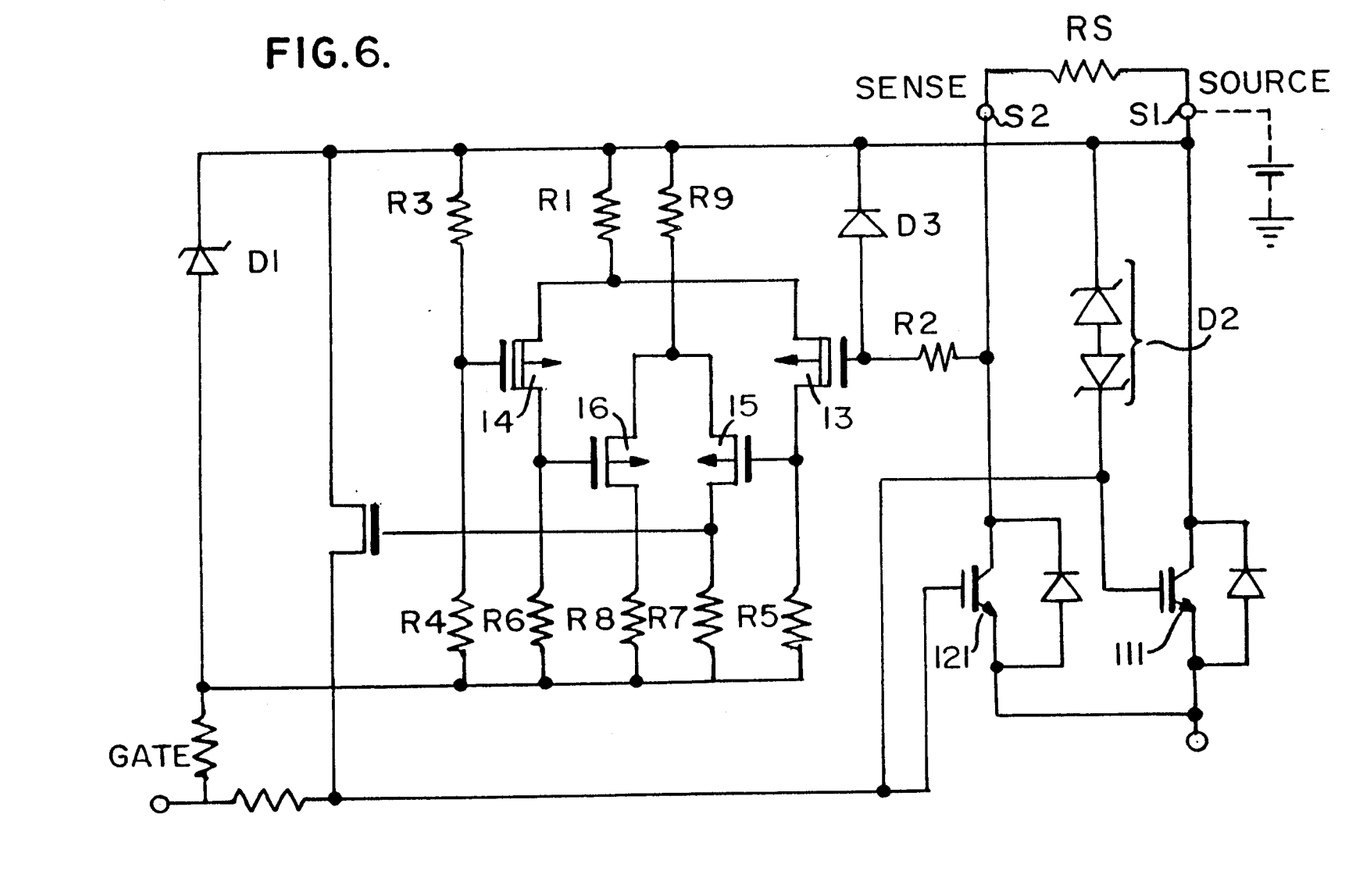
FIG. 6 is a circuit diagram showing a semiconductor apparatus according to still another embodiment of the present invention.

FIG. 6 shows a semiconductor apparatus according to still another embodiment of the present invention, in which a power element is constituted by insulated gate bipolar transistors 111 and 121 in place of MOS transistors 11 and 12 shown in FIG. 1.

Figure 7:
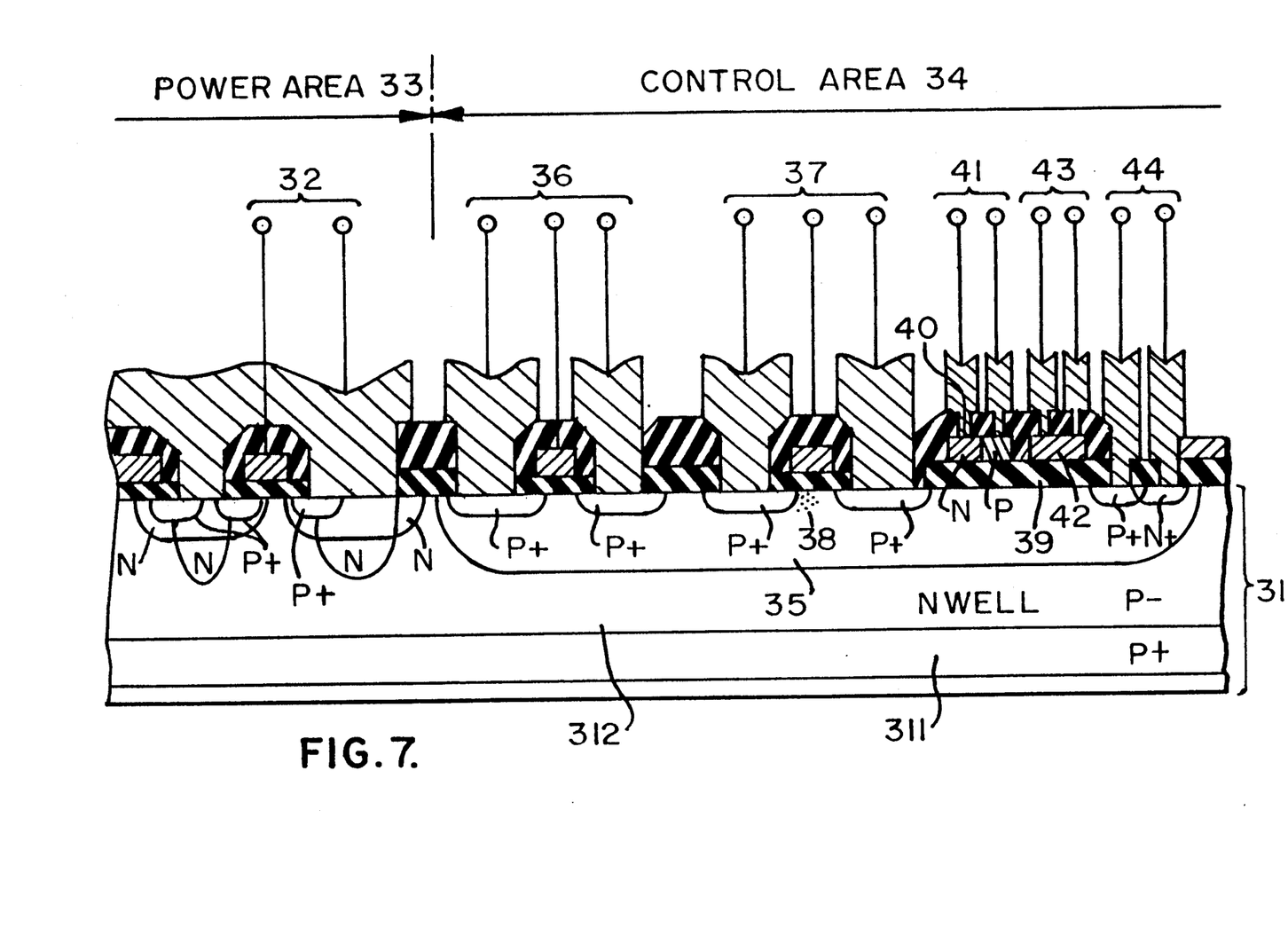
FIG. 7 is a sectional view showing a sectional structure of the semiconductor apparatus according to another embodiment of the invention.

FIG. 7 shows a power semiconductor apparatus wherein layers of conductivity type P and N of the device shown in FIG. 3 are respectively replaced with layers of conductivity type N and P.

What is claimed is:
1. A power semiconductor apparatus comprising:
   a control element comprising a first insulated gate type transistor ON/OFF-controlled in response to an input control signal;
   a load sensing resistor element for generating a voltage signal corresponding to an amount of current to be supplied to said control element;
   a differential amplifier constituted by a pair of depletion type MOS transistors, for constituting an input stage of a control amplifier, said control amplifier including said differential amplifier being formed together with said control element on a single semiconductor chip;
   current amount limiting means for controlling said control element in response to an output signal from said control amplifier including said differential amplifier to control the amount of current supplied to a load through said control element; and
   a second insulated gate type transistor including a drain and a gate respectively connected to a drain and a gate of said first insulated gate type transistor constituting said control element to connect said load to a common drain electrode, said second insulated gate type transistor constituting a current sensing circuit together with said first insulated gate type transistor, said second insulated gate type transistor constituting a load current sensing circuit upon connection of said load current sensing resistor element between source electrodes of said first and second insulated gate type transistors, said first and second insulating gate type transistors and said pair of depletion type MOS transistors each being of a same conductivity type.

2. An apparatus according to claim 1, wherein said second insulated gate type transistor and said first insulated gate type transistor which have the same conductivity type are formed on a single semiconductor chip.

3. An apparatus according to claim 1, wherein said first and second insulated gate type transistors are constituted of insulated gate bipolar transistors.

4. An apparatus according to claim 3, wherein said insulated gate bipolar transistors are constituted by MOS transistors.

5. A power semiconductor apparatus comprising:
   a control element comprising a first insulated gate type transistor ON/OFF-controlled in response to an input control signal;
   a load sensing resistor element for generating a voltage signal corresponding to an amount of current to be supplied to said control element;
   a first differential amplifier constituted by a pair of depletion type MOS transistors, for constituting an input stage of a control amplifier, said control amplifier including said first differential amplifier being formed together with said control element on a single semiconductor chip;
   first current amount limiting means for controlling said control element in response to an output signal from said control amplifier including sad first differential amplifier to control the amount of current supplied to a load through said control element;
   a second insulated gate type transistor including a drain electrode commonly connected to a drain electrode of said first insulated gate type transistor constituting said control element to connect said load to a common drain electrode, said second insulated gate type transistor constituting a current sensing circuit together with said first insulated gate type transistor, said second insulated gate type transistor constituting a load current sensing circuit upon connection of said load current sensing resistor element between source electrodes of said first and second insulated gate type transistors;
   temperature sensing means for sensing a state in which a temperature of said substrate is increased;
   a second differential amplifier for receiving a sensing signal from said temperature sensing means; and
   second current amount limiting means for limiting the amount of current to be supplied to said load in response to an output from said second differential amplifier.

6. An apparatus according to claim 5, wherein said first current amount limiting means and said first second current amount limiting means are constituted by third and fourth MOS transistors controlled in response to the output from said first differential amplifier and an output from said second differential amplifier, respectively, said third and fourth MOS transistors and said first and second MOS transistors which have the same conductivity type being formed on a single semiconductor chip.

7. An apparatus according to claim 5, further comprising:
a fifth MOS transistor connected to said third MOS transistor for constituting said first current amount limiting means through a common gate, said fifth MOS transistor outputting a diagnostic output when a current limitation operation is performed.

8. An apparatus according to claim 5, further comprising:
a fifth MOS transistor connected to said third MOS transistor for constituting said first current amount limiting means through a common gate, said fifth MOS transistor outputting a diagnostic output when a current limiting operation is performed by said first current amount limiting means; and
a sixth MOS transistor connected to said fourth MOS transistor for constituting said second current limiting means through a common gate, said sixth MOS transistor outputting a diagnostic output when a current limiting operation is performed by said second current amount limiting means.

9. A power semiconductor comprising:
a semiconductor substrate;
an active element comprising a power element formed by double diffusion on said semiconductor substrate, said active element having a channel of a first conductivity type;
a well formed in a surface of said semiconductor substrate and being a second conductivity type; and
a control element formed on said well for controlling said active element, said control element including a plurality of elements different from said active element and constituted by enhancement and depletion type MOS transistors having channels of said first conductivity type.

10. An apparatus according to claim 9, wherein said well is p-type, and said MOS transistors are n-channel type.

11. An apparatus according to claim 9, wherein said well is n-type, and said MOS transistors are p-channel type.

* * * * *